United States Patent
Naffziger

(10) Patent No.: US 6,188,633 B1
(45) Date of Patent: Feb. 13, 2001

(54) MULTI-PORT COMPUTER REGISTER FILE HAVING SHARED WORD LINES FOR READ AND WRITE PORTS AND STORAGE ELEMENTS THAT POWER DOWN OR ENTER A HIGH-IMPEDANCE STATE DURING WRITE OPERATIONS

(75) Inventor: Samuel D. Naffziger, Fort Collins, CO (US)

(73) Assignee: Hewlett-Packard Company, Palo Alto, CA (US)

( * ) Notice: Under 35 U.S.C. 154(b), the term of this patent shall be extended for 0 days.

(21) Appl. No.: 09/067,702

(22) Filed: Apr. 28, 1998

(51) Int. Cl.[7] .................................................. G11C 8/00
(52) U.S. Cl. ............... 365/230.05; 365/154; 365/189.04; 365/189.05
(58) Field of Search .............................. 365/154, 189.04, 365/189.05, 230.05

(56) References Cited

U.S. PATENT DOCUMENTS

| | | | |
|---|---|---|---|
| 5,315,178 | * 5/1994 | Snider ............................. | 365/230.05 |
| 5,321,652 | * 6/1994 | Ito ................................... | 365/189.07 |
| 5,481,495 | * 1/1996 | Henkel et al. .................. | 365/189.02 |
| 5,724,299 | * 3/1998 | Podlesny et al. ................ | 365/230.05 |

* cited by examiner

*Primary Examiner*—David Nelms
*Assistant Examiner*—Gene N. Auduong
(74) *Attorney, Agent, or Firm*—David A. Plettner

(57) ABSTRACT

A multi-port computer register file has shared word lines for read and write ports and storage elements that power down during write operations. Assume that a register file in accordance with the present invention has R read ports and W write ports, and R is greater than W. In such a register file, each register will be accessed by W combined read/write word lines, a single direction line, and R—W read-only word lines. The direction line is asserted during a write operation, and is not asserted during a read operation, and also allows the storage elements comprising each register of the register file to be powered down or enter a high-impedance state during a write operation. During a read operation, the direction line remains deasserted and the storage elements remain powered up and active. For read ports sharing combined read/write word lines with write ports, the direction line is used as a multiplexer signal to enable a read operation at the read port represented by the combined read/write word line. For read ports that are not shared, a read-only word line is used to enable the read operation. During a write operation, the direction line is asserted and the storage elements are powered down or enter a high-impedance state. The direction line is used as a multiplexer signal to enable a write operation at the write port represented by the combined read/write word line. When the write operation ends, the direction line is deasserted, and the storage elements are powered up or leave the high-impedance state, thereby retaining the value written to the storage elements. The present invention provides two important benefits over the prior art. First, by powering down storage elements or placing storage elements in a high-impedance state during write operations, smaller transistors can be used to write values into storage elements. By using smaller transistors, the size and power requirements of the register file are reduced. Second, by using a direction line and combined word lines for read and write ports, the number of horizontal lines running across the register file are reduced.

7 Claims, 9 Drawing Sheets

MULTI-PORT COMPUTER REGISTER FILE HAVING SHARED WORD LINES FOR READ AND WRITE PORTS AND STORAGE ELEMENTS THAT POWER DOWN OR ENTER A HIGH-IMPEDANCE STATE DURING WRITE OPERATIONS

FIELD OF THE INVENTION

The present invention relates to registers used in computer processors. More specifically, the present invention relates to register write operations and the organization and configuration of word lines in registers.

DESCRIPTION OF THE RELATED ART

In the art of computing, registers are used within a processor for temporary storage of variables. A collection of such registers is known in the art as a register file. Typically, a register file includes a plurality of read and write ports to allow multiple operands to be written to and read from the register file in a single clock cycle.

Computer systems perform tasks by executing instructions, and the speed of a computer system is largely determined by the rate at which instructions are executed. One technique used by computer designers to increase the instruction execution rate is to include multiple execution units, with each execution unit capable of executing instructions in parallel with the other units. To support additional execution units, the register file must have sufficient read and write ports to allow the execution units to access the register file concurrently. Since many instructions read two or more operands from the register file and write a single operand, it is common for register files to have more read ports than write ports.

A typical prior art register file is arranged into rows and columns of static storage elements. Each static storage element stores a bit and is commonly implemented by connecting a pair of inverters together to form a feedback loop. Each row of storage elements forms a register of the register file. A row is also known in the art as a word. Each column of storage elements stores common bit positions of all the registers. For example, the first column may store bit 0 for each register.

For every row of the register file a word line is provided for each port. Typically the word lines run horizontally across the register file. For every column of the register file, a data line is provided for each port. Typically the data lines run vertically across the register file.

Consider a prior art register file having 128 64-bit registers, with twelve read ports and eight write ports. Such a register file will require 20 horizontal word lines for each register (twelve for the read ports and eight for the write ports) and 20 vertical data line for each bit position (again, twelve for the read ports and eight for the write ports). Accordingly, such a register will have 2560 horizontal word lines and 1280 vertical lines. The result is a register file completely dominated by wiring, which increases the size and complexity of the register file. As computer designers continue to increase the number of execution units in a processor, and therefore increase the number of ports in a register file, the problem will worsen. Accordingly, what is needed in the art is a register file configuration that reduces the number of lines required compared to prior art configurations, thereby allowing designers to continue to add ports to register files without being constrained by wiring.

SUMMARY OF THE INVENTION

The present invention is a multi-port computer register file having shared word lines for read and write ports and storage elements that power down or enter a high-impedance state during write operations. In accordance with the present invention, a register file has R read ports and W write ports. Typically, a register file will have more read ports than write ports, but the invention is not limited to this configuration.

Assume that a register file in accordance with the present invention has more read ports than write ports, as is common in the art. In such a register file, each register will be accessed by W combined read/write word lines, a single direction line, and R—W read-only word lines. The direction line is asserted during a write operation, and is not asserted during a read operation. A prior art register file would have R+W word lines. Therefore, if a register file has 12 read ports and 8 write ports, a prior art register file would have 20 horizontal lines for each register, while a register file in accordance with the present invention would have 13 horizontal lines for each register, which is a reduction of 35% in the number of horizontal word lines.

The direction line also allows the storage elements comprising a register to be powered down or enter a high-impedance state during a write operation. In the prior art, a typical storage element comprises a pair of inverters coupled into a feedback loop. During a write operation in a prior art register file, the output drivers of the write buffers overpower the output drivers of the storage elements, thereby causing the storage elements to assume the values provided by the write buffers. In the present invention, during a write operation the direction line is asserted and the storage elements are powered down or enter a high-impedance state. Therefore, the write buffers may be provided with smaller output drivers since they are not required to overpower the output drivers of the storage elements. When a write operation ends, the direction line is deasserted and the storage elements are powered up or leave the high-impedance state, thereby retaining the value provided by the write buffers. The direction line is also used as a multiplexer signal to enable the write operation at the write port represented by the combined read/write word line.

During a read operation, the direction line remains deasserted and the storage elements remain powered up and are not in a high-impedance state. For read ports sharing combined read/write word lines with write ports, the direction line is used as a multiplexer signal to enable a read operation at the read port represented by the combined read/write word line. For read ports that are not shared, a read-only word line is used to enable the read operation.

For a register file having an equal number of read and write ports, all ports are accessed using combined read/write word lines. For a register file have more write ports than read ports, all read ports and a number of write ports equal to the number of read ports are accessed using combined read/write word lines. Write ports in excess of the number of read ports are accessed using write-only word lines.

The present invention provides two important benefits over the prior art. First, by powering down storage elements or allowing storage elements to enter a high-impedance state during a write operation, smaller transistors can be used to write values into storage elements. By using smaller transistors, the size and power requirements of the register file are reduced. Second, by using a direction line and combined word lines for read and write ports, the number of horizontal lines running across the register file are reduced. Accordingly, the present invention provides a computer designer with the ability to implement a register file having a large number of read and write ports, while reducing the number of horizontal lines and reducing the size of output driver transistors used during write operations compared to prior art register file configurations.

DETAILED DESCRIPTION OF THE PREFERRED EMBODIMENTS

The present invention is a register file that reduces the number of horizontal word line lines compared to prior art register file organizations by using combined word lines to perform both read and write operations. The present invention also reduces the size of transistors used during write operations by either powering down storage elements during write operations or placing storage elements in a high-impedance state during write operations. Before considering the present invention in greater detail, a prior art register file will be discussed below with reference to FIGS. 1 and 2.

Figure 1:
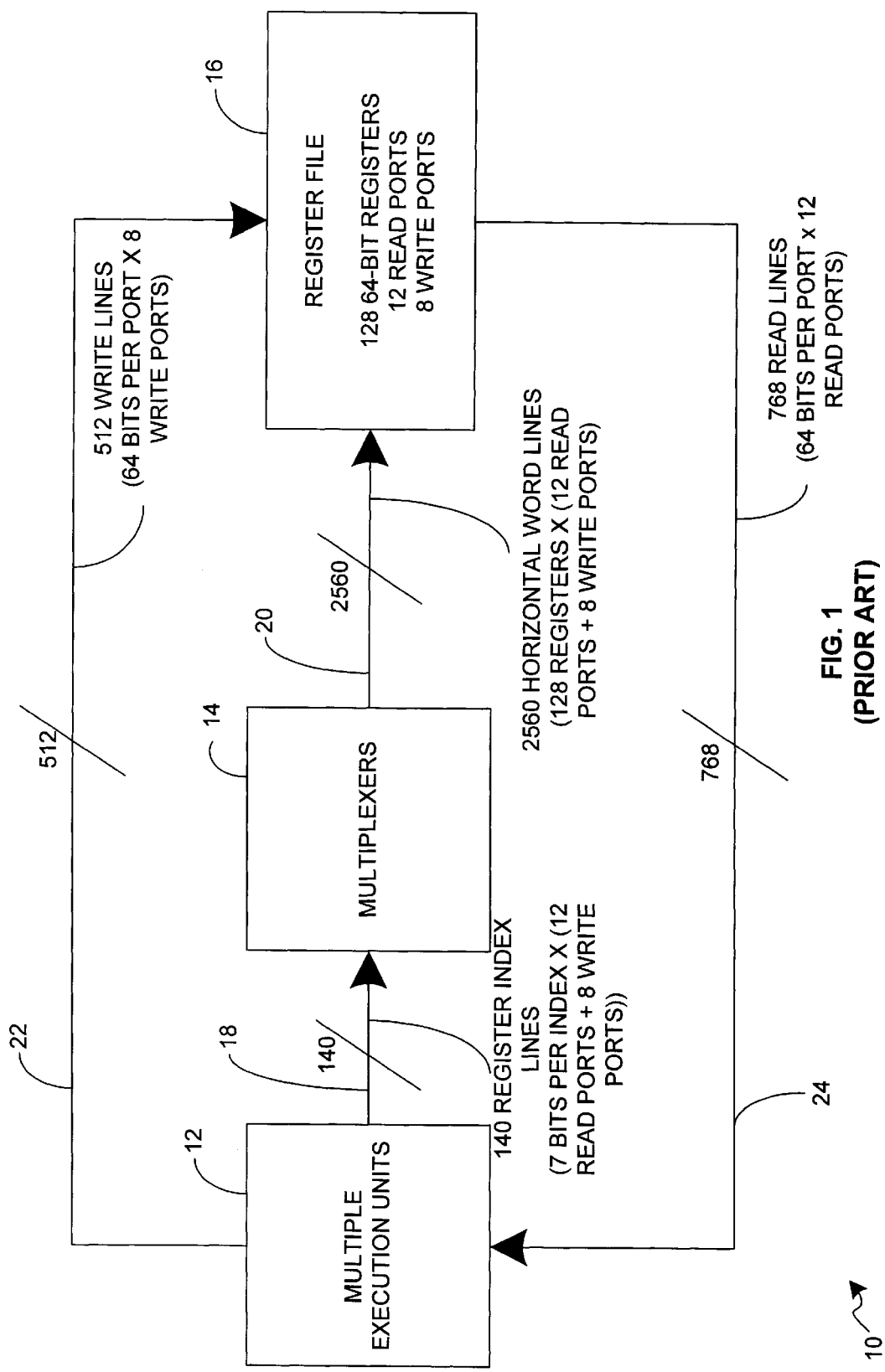
FIG. 1 is a simplified diagram showing a prior art processor that includes a prior art register file.

FIG. 1 is a simplified diagram showing prior art processor 10. For simplicity and to better understand the present invention, only those portions of processor 10 relating to the register file are shown in FIG. 1.

Processor 10 includes multiple execution units 12, multiplexers 14, and register file 16. Register file 16 includes 128 64-bit registers, 12 read ports, and 8 write ports. When one or more of the execution units of multiple execution units 12 seeks to read from or write to registers of register file 16, each execution unit communicates the registers that are to be accessed over bus 18. Bus 18 includes 140 register index lines. Each port requires 7 bits to select a register, and there are 20 ports (12 read ports and 8 write ports). If an execution unit is performing a write operation, the write data for the corresponding port is provided by the execution unit over bus 22. Bus 22 includes 512 write lines. Each port is 64 bits wide and there are 8 write ports. If an execution unit is performing a read operation, the read data for the corresponding port is provided by register file 16 over bus 24. Bus 24 includes 768 read lines. Again, each port is 64 bits wide and there are 12 read ports.

Returning to bus 18, the registers that are to be accessed are provided to multiplexers 14, which in turn decode the 7 bit port identifications into the corresponding word lines. The word lines are provided to register file 16 via bus 20. Bus 20 is 2560 bits wide. Twelve read word lines and 8 write word lines are provided for each of the 128 registers. Those skilled in the art will recognize that other synchronization and clock signals are required to complete processor 10. Such signals need not be shown to understand the present invention.

Figure 2:
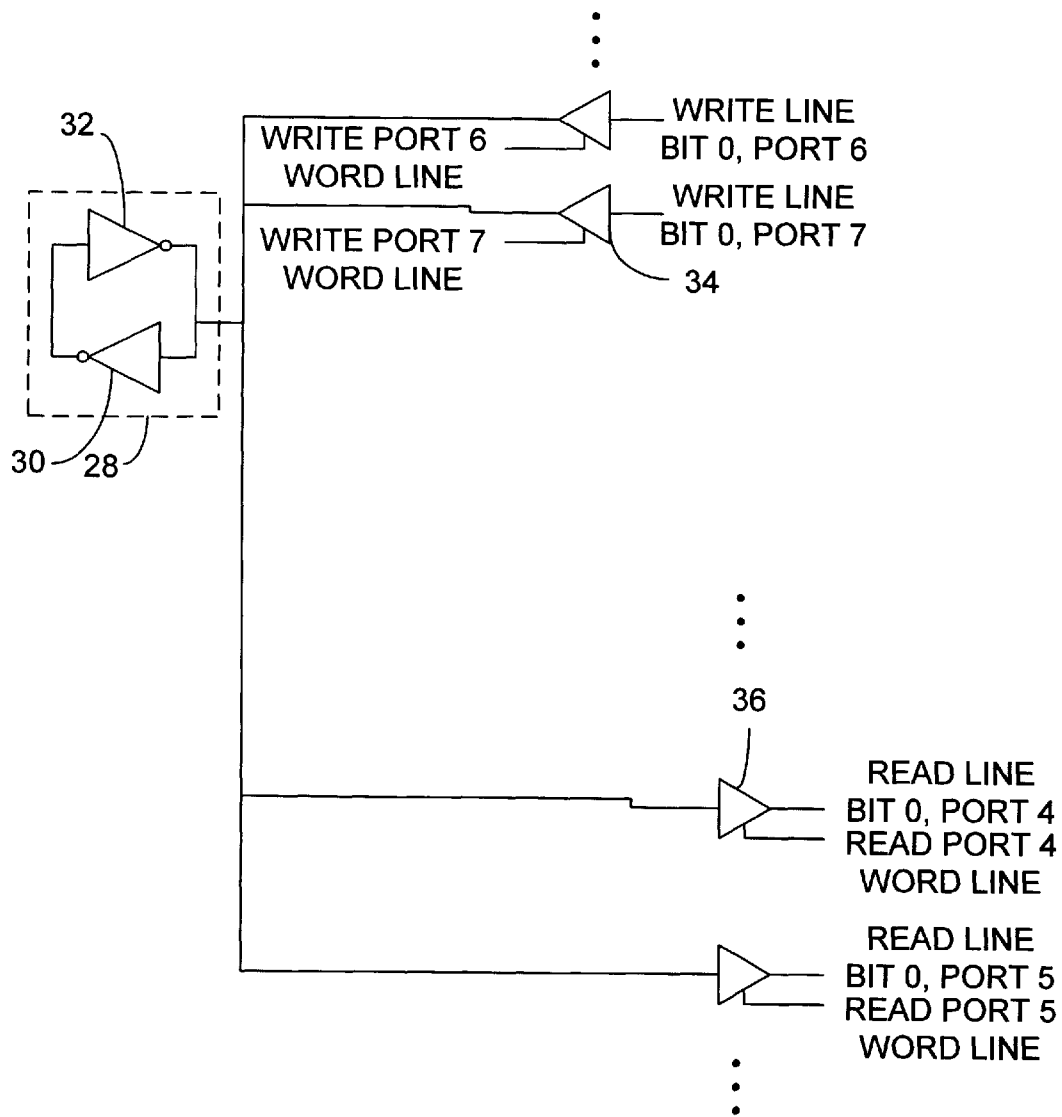
FIG. 2 shows a portion of one of the registers of the prior art register file shown in FIG. 1.

FIG. 2 shows a portion of one of the registers of prior art register file 16 of FIG. 1. The portion of register file 16 shown in FIG. 2 includes the circuitry required to write to bit 0 of the register at write ports 6 and 7, and the circuitry required to read from bit 0 of the register at read ports 4 and 5. For example, tri-state buffer 34 is used to write bit 0 to the register at port 7 and tri-state buffer 36 is used to read bit 0 from the register at port 4. To complete the register file, one would first need to add 6 more tri-state buffers for the remaining write ports and 10 more tri-state buffers for the remaining read ports. Then one would need to add 63 more instances of the circuit shown in FIG. 2 to complete the 64-bit register. Finally, one would need to add 127 more registers. The circuit shown in FIG. 2 and the corresponding discussion below illustrate the logical operation of a prior art register file. Those skilled in the art will recognize that a transistor level implementation of the circuit shown in FIG. 2 may include additional circuitry. For example, a word line may be logically presented to all bits of a register, while a transistor level implementation may have additional buffers to avoid overloading the word line.

Storage element 28 stores bit 0 for the register. Element 28 comprises inverters 30 and 32 coupled in a feedback loop. Assume that one of the execution units of multiple execution units 12 of FIG. 1 seeks to read an operand from the portion of the register shown in FIG. 2 via read port 4. The execution unit first presents the appropriate register index on the register index lines of bus 18 corresponding to read port 4. Multiplexers 14 then decode the register index and assert the word line for read port 4 for this register, which is coupled to the enable input of tri-state buffer 36. Note that this word line is also presented in parallel to the enable inputs of similar tri-state buffers for read port 4 associated with the storage elements that comprise the remaining 63 bits of the register. When the word line is asserted, tri-state buffer 36 drives the read line of read port 4, bit 0 to the value stored in storage element 28. Note that the read line of read port 4, bit 0 is coupled in parallel to the outputs of similar tri-state buffers associated with read port 4, bit 0 of the remaining 127 registers. The value provided at the output of buffer 36 is then transmitted back to the execution unit via bus 24 in FIG. 1. The execution unit then removes the register index from bus 18 and multiplexers 14 deasserts the word line via bus 20.

Now assume that one of the execution units seeks to write an operand via write port 7. The execution unit first places the operand on the write lines of bus 22 corresponding to write port 7. The write line of write port 7, bit 0 is provided to the input of buffer 34. In addition, this write line is coupled in parallel to the inputs of similar tri-state buffers associated with write port 7, bit 0 of the remaining 127 registers. Next, the execution unit presents the appropriate register index on the register index lines of bus 18 corresponding to write port 7. Multiplexers 14 then decode the register index and assert the word line for write port 7 for this register via bus 20, which is coupled to the enable input of tri-state buffer 34. Note that this word line is also presented in parallel to the enable inputs of similar tri-state buffers for write port 7 associated with the storage elements that comprise the remaining 63 bits of the register. When the word line is asserted, the output of tri-state buffer 34 is driven to the value provided by the execution unit. The output driver of buffer 34 is designed to be stronger than the output driver of inverter 32. Accordingly, buffer 34 overpowers inverter 32 and changes the value stored in storage element 30 (assuming that the value being written is different than the value previously stored in element 30). The execution unit then removes the register index from bus 18 and multiplexers 14 deassert the word line via bus 20. Finally, the execution unit removes the operand from bus 22 and the write operation is complete.

Note that in the prior art register file shown in FIGS. 1 and 2, each register requires a word line for each write port and a word line for each read port. In addition, the buffers used to write to the storage elements, such as buffer 34, must be fabricated using output driver transistors that are larger than the output driver transistors used to form the inverters of the storage elements. In the present invention, word lines associated with write ports are also associated with read ports by using a direction line. In addition, the output buffers of the storage element inverters are powered down or enter a high-impedance state during a write operation, thereby allowing smaller transistors to be used to form the output drivers of the buffers that write data into the storage elements.

Figure 3:
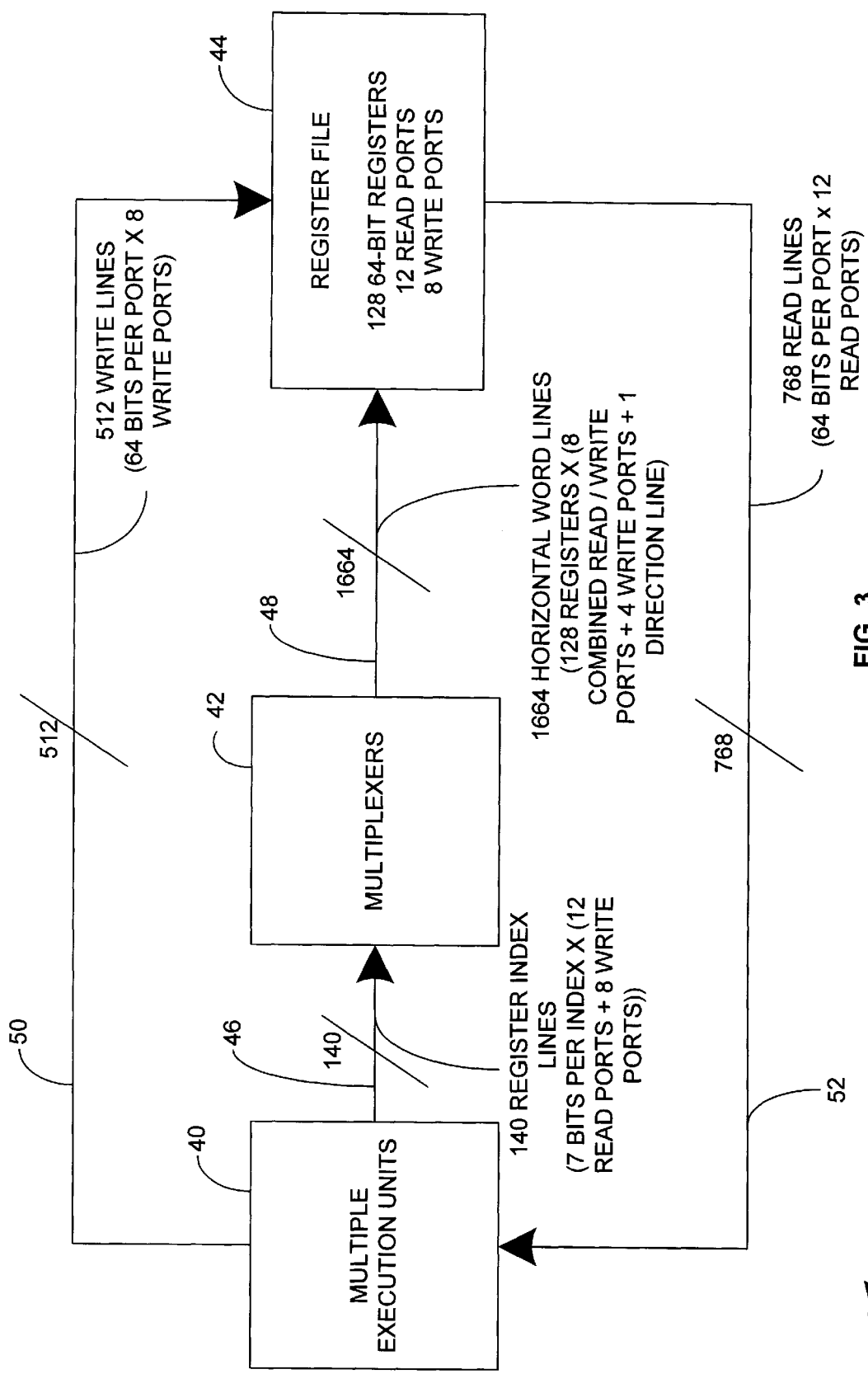
FIG. 3 is a simplified block diagram showing a processor having a register file in accordance with the present invention.

FIG. 3 is a simplified block diagram showing a processor 38 having a register file in accordance with the present invention. Processor 38 includes multiple execution units 40, multiplexers 42, and register file 44. Register file 44 includes 128 64-bit registers, 12 read ports, and 8 write ports. In FIG. 3, multiple execution units 40 and busses 46,50, and 52 operate in a manner similar to prior art multiple execution units 12 and busses 18,22, and 24, respectively, shown in FIG. 1. However, the operation of multiplexers 42, bus 48, and register file 44 differs, in accordance with the present invention.

Similar to the operation of processor 10 in FIG. 1, when one or more of the execution units of multiple execution units 40 seeks to read from or write to registers of register file 44, each execution unit communicates the registers that are to be accessed over bus 46. Bus 46 includes 140 register index lines. Each port requires 7 bits to select a register, and there are 20 ports (12 read ports and 8 write ports). If an execution unit is performing a write operation, the write data for the corresponding port is provided by the execution unit over bus 50. Bus 50 includes 512 write lines. Each port is 64 bits wide and there are 8 write ports. If an execution unit is performing a read operation, the read data for the corresponding port is provided by register file 44 over bus 52. Bus 52 includes 768 read lines. Again, each port is 64 bits wide and there are 12 read ports.

Returning to bus 46, the registers that are to be accessed are provided to multiplexers 42, which in turn decode the 7 bit port identifications. However, in contrast to multiplexers 14 in FIG. 1, multiplexers 42 provide 8 word lines for each register as combined read/write word lines, with each of the combined word lines representing a read port and a write port. In addition, multiplexers 42 provide a direction line for each register that indicates whether that register is to be read from or written to. Finally, multiplexers 42 generate 4 additional read-only word lines. Note that read-only word lines are used in the present invention only when the register file has more read ports than write ports, as is common in the art. The combined read/write word lines, the direction line, and the read-only word lines are provided for each register to register file 44 via bus 48. Bus 48 is 1664 bits wide. Eight combined read/write word lines, one direction line, and 4 read-only word lines are provided to each of the 128 registers. As in FIG. 1, those skilled in the art will recognize that other synchronization and clock signals are required to complete processor 38. Such signals need not be shown to understand the present invention.

As seen by comparing prior art FIG. 1 with FIG. 3, the present invention provides a substantial decrease in the number of horizontal lines that traverse the register file, even though both register files provide similar functionality. In FIG. 1, 2560 horizontal lines run across prior art register file 16. However, in FIG. 3, in accordance with the present invention, only 1664 horizontal lines run across register file 44. Accordingly, for the register file configuration shown in FIGS. 1 and 3, the present invention provides a 35% reduction in the number of horizontal lines, thereby producing a more compact register file. Of course, reducing the number of horizontal lines also simplifies the problems associated with routing and laying out the register file when designing an integrated circuit incorporating a register file in accordance with the present invention.

Figure 4A:
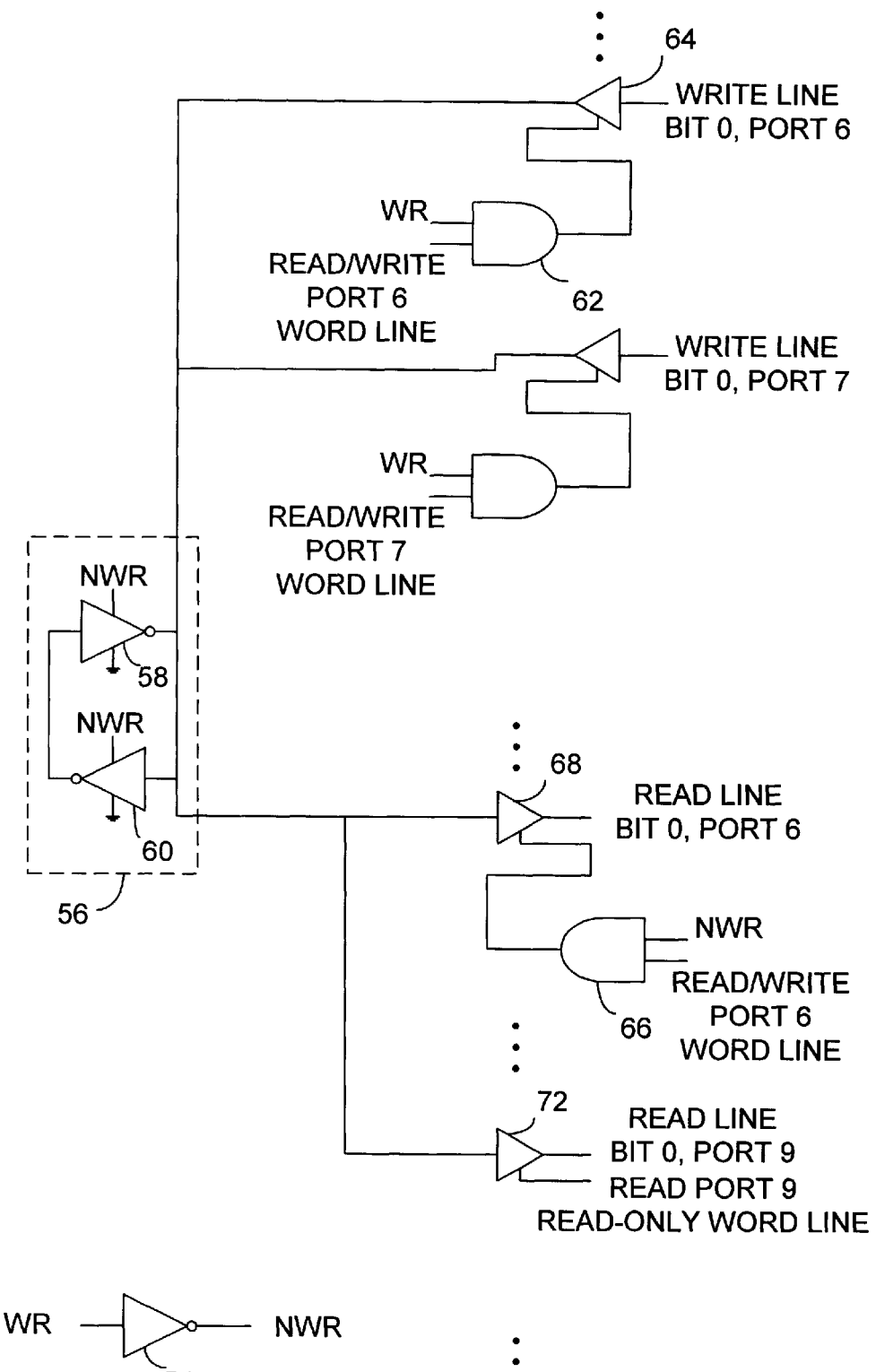
FIG. 4A shows a portion of one of the registers of the register file shown in FIG. 3, in accordance with the present invention.

FIG. 4A shows a portion of one of the registers of register file 44 of FIG. 3, in accordance with the present invention. The portion of register file 44 shown in FIG. 4A includes the circuitry required to write to bit 0 of the register at write ports 6 and 7, and the circuitry required to read from bit 0 of the register at read ports 6 and 9. For example, tri-state buffer 64 is used to write bit 0 to the register at port 6 and tri-state buffer 72 is used to read bit 0 from the register at port 9. To complete the register file, one would first need to add 6 more tri-state buffers for the remaining write ports and 10 more tri-state buffers for the remaining read ports. In addition, one would need to add AND gates for ports having combined read/write word lines, such as AND gates 62 and 66. Then one would need to add 63 more instances of the circuit shown in FIG. 4A to complete the 64-bit register. Finally, one would need to add 127 more registers. Those skilled in the art will recognize that a transistor level implementation of the circuit shown in FIG. 4A may include additional circuitry. For example, a word line may be logically presented to all bits of a register, while a transistor level implementation may have additional buffers to avoid overloading the word line, as will be discussed below with reference to FIGS. 6 and 7, which are transistor level schematic diagrams.

As described above with reference to FIG. 3, multiplexers 42 provide a direction line for each register via bus 48. In FIG. 4A, the direction line is labeled WR. The direction line is driven high during write operations, but otherwise remains low. The direction line is provided to inverter 54, which generates an inverted copy of the direction line labeled NWR at the output of inverter 54.

Storage element 56 stores bit 0 for the portion of the register shown in FIG. 4A. Storage element 56 comprises inverters 58 and 60, which are coupled into a feedback loop. Each inverter is powered by the signal NWR. Accordingly, storage element 56 is powered up during a read operation when WR is low and NWR is high, and is powered down during a write operation when WR is high and NWR is low.

Consider a write operation addressed to the register shown in FIG. 4A at port 6 by one of the execution units of multiple execution units 40 in FIG. 3. The execution unit drives the lines of bus 50 corresponding to write port 6 to the operand to be written to the register and presents the appropriate register index on the register index lines of bus 46 corresponding to read port 6. Multiplexers 42 then decode the register index and first drive the direction line WR for this register high via bus 48. This causes storage element 56 to be powered down. Next, multiplexers 42 drive the combined read/write word line corresponding to read port 6 and write port 6 high via bus 48. AND gate 62 performs a logical AND operation of the direction line WR and the combined word line, with the output of gate 62 provided to the enable input of tri-state buffer 64. The combined read/write word line for read and write ports 6 is also provided to an input of AND gate 66. However, since the inverted direction line NWR is low during a write operation, tri-state buffer 68 (which is used during a read operation from read port 6) is not enabled. Note that only one instance of AND gate 62 is logically required for the register. The output of gate 62 can be provided in parallel to the other tri-state buffers used to write the other bits of the register at write port 6.

Since tri-state buffer 64 is enabled, the value provided by the write line corresponding to bit 0, port 6 is propagated to the output of buffer 64. In addition, this write line is coupled in parallel to the inputs of similar tri-state buffers associated with write port 6, bit 0 of the remaining 127 registers. Since storage element 56 is powered down, the output of buffer 64 drives the conductor coupling the output of inverter 58 to the input of inverter 60 to the value provided by the write line. Next, multiplexers 42 drive the direction line WR low, causing storage element 56 to be powered up and to retain the value written via buffer 64, and drive the combined word line for read and write ports 6 low. Finally, the execution unit removes the operand from bus 50. Note that in accordance with the present invention, the output drivers of the tri-state buffers used during write operations need not overpower the output drivers of inverters forming the storage elements because the storage elements are powered down, thereby allowing smaller output drivers to be used to form tri-state buffers such as buffer 64. In contrast, in prior art register file configurations, as described above, the output drivers of the tri-state buffers used during write operations must overpower the output drivers of inverters forming the storage elements, thereby requiring larger output buffers to be used to form tri-state buffers such as buffer 34 of FIG. 2.

Now consider that one of the execution units of multiple execution units 40 of FIG. 3 seeks to read an operand from the portion of the register shown in FIG. 4A via read port 6. The execution unit first presents the appropriate register index on the register index lines of bus 46 corresponding to read port 6. Multiplexers 42 then decode the register index and assert the combined word line for read port 6 and write port 6 via bus 48. Note that the direction line provided for this register by multiplexers 42 via bus 48 remains low, thereby maintaining storage element 56 in a powered up state. The combined word line is provided to AND gate 66 along with the inverted direction line NWR, which is high, and the output of gate 66 is coupled to the enable input of tri-state buffer 68. Note that the output of gate 66 can also be logically presented in parallel to the enable inputs of similar tri-state buffers for read port 6 associated with the storage elements that comprise the remaining 63 bits of the register. This combined word line is also presented to AND gate 62 as described above. However, since the direction line WR is low, tri-state buffer 64 is not enabled. When the word line is asserted, tri-state buffer 68 is enabled and drives the read line of read port 6, bit 0 to the value stored in storage element 56. Note that the read line of read port 6, bit 0 is coupled in parallel to the outputs of similar tri-state buffers associated with read port 6, bit 0 of the remaining 127 registers. The value provided at the output of buffer 68 is then transmitted back to the execution unit via bus 52 in FIG. 3. The execution unit reads the operand from bus 52, and removes the register index from bus 46. In turn, multiplexers 42 drive the combined word line low via bus 48.

As is common in the art, register file 44 has more read ports than write ports. Accordingly, read ports in excess of the number of write ports do not use a combined read/write word line. Rather, such ports are enabled using a read-only word line. In FIG. 4A, read port 9 is such a port. The operation of read port 9 is similar to the operation of read port 6, as described above, with multiplexers 42 driving the read-only word line for read port 9 high via bus 48, and driving the direction line WR low via bus 48 (thereby maintaining storage element 56 in a powered up state). However, an AND gate, such as gate 66, is not logically required. Instead, the read-only word line for read port 9 is provided directly to the enable input. Note that this read-only word line can also be presented in parallel to the enable inputs of similar tri-state buffers for read port 9 associated with the storage elements that comprise the remaining 63 bits of the register. Of course, if a register file in accordance with the present invention has more write ports then read ports, write ports in excess of the number of read ports would be enabled by write-only word lines. Also, if the number of read and write ports is equal, all word lines would be combined read/write word lines.

Figure 4B:
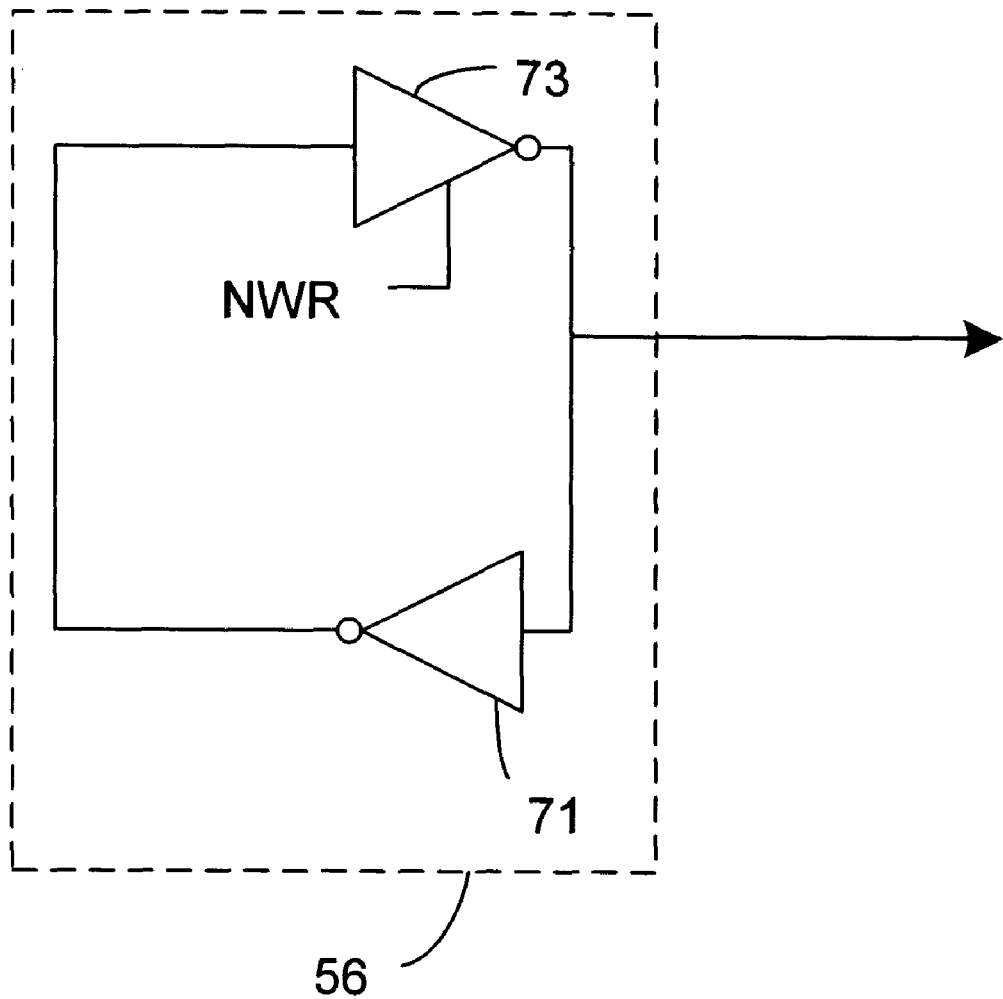
FIG. 4B shows a different embodiment of a storage element that may be used in the portion of the register shown in FIG. 4A.

FIG. 4B shows another embodiment of storage element 56 of FIG. 4A. In FIG. 4B, inverters 71 and 73 are coupled into a feedback loop. However, instead of powering down during a write operation, inverter 73 is a tri-state inverter that is enabled via the inverted direction line NWR. Accordingly, during a write operation when NWR goes low, the output of inverter 73 enters a high-impedance state. This provides the same benefit as powering down the storage element since the output drivers of the write buffers, such as tri-state buffer 64, do not need to overpower the output buffers of inverters forming the storage elements. When not performing a write operation, NWR is high and the output of inverter 73 is active, thereby maintaining the value stored in the storage element.

Figure 5:
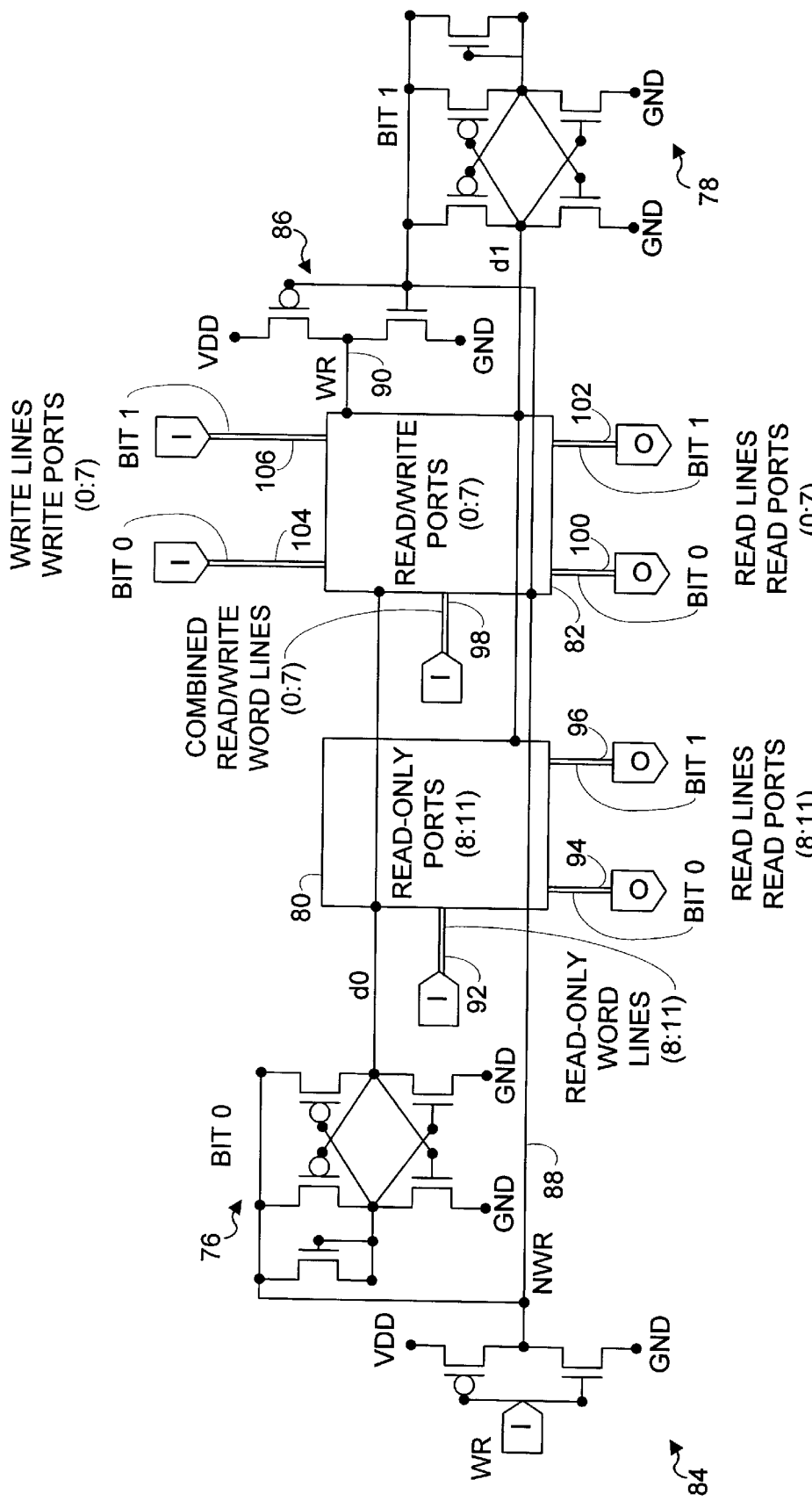
FIGS. 5, 6 and 7, taken together, are a transistor level schematic diagram showing a specific embodiment of the present invention for two bits of a register having 8 write ports and 12 read ports.

FIGS. 5, 6, 7, and 8, taken together, are a transistor level schematic diagram showing a specific embodiment of the present invention for two bits of a register having 8 write ports and 12 read ports. With reference to FIG. 5, register 74 includes storage elements 76 and 78, read-only ports (8:11) block 80, read/write ports (0:7) block 82, and inverters 84 and 86.

Storage elements 76 and 78 each comprise a pair of inverters coupled in a feedback loop. Each inverter is comprised of an n-channel field effect transistor (NFET) and a p-channel field effect transistor (PFETs). The data bits stored in each storage element are provided to blocks 80 and 82, which will be described in greater detail below. The direction line WR is provided to inverter 84. Inverter 84 also comprises a PFET and an NFET. The output of inverter 84 is the inverted direction line NWR and provides power to storage elements 76 and 78 via conductor 88. The inverted direction line is also provided to block 82, but not block 80. Inverter 86 also comprises a PFET and an NFET. Inverter 86 receives the inverted direction line NWR via line 88, and provides the direction line WR to block 82 via conductor 90.

Read-only word lines (8:11) are provided to block 80 as inputs via bus 92. The read lines for read ports (8:11) are provided by block 80 as outputs via bus 94 for bit 0, and via bus 96 for bit 1.

Combined read/write word lines (0:7) are provided to block 82 as inputs via bus 98. The read lines for read ports (0:7) are provided by block 82 as outputs via bus 100 for bit 0, and via bus 102 for bit 1. Finally, the write lines for write ports (0:7) are provided to block 82 as inputs via bus 104 for bit 0, and via bus 106 for bit 1.

Figure 6:
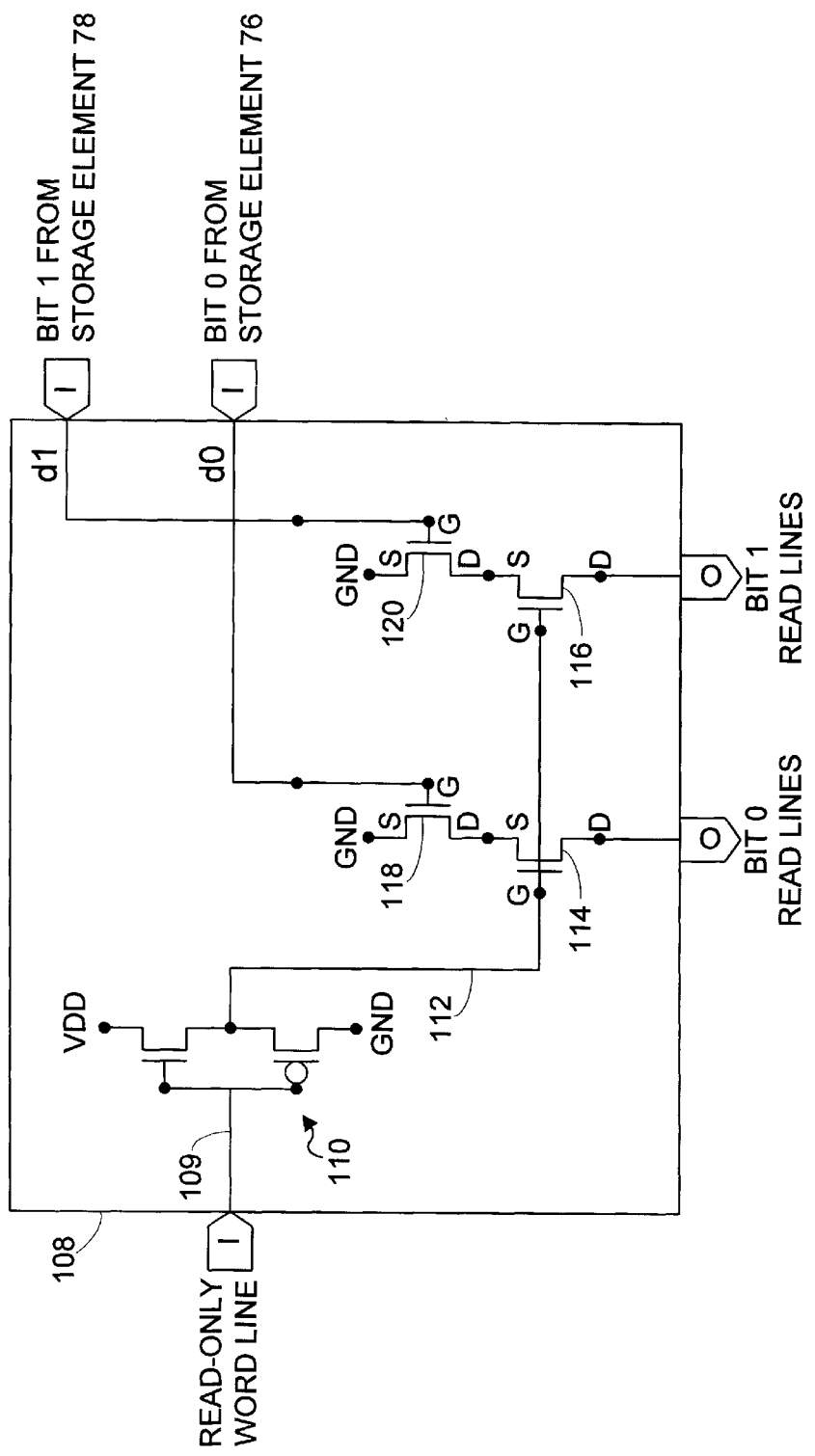

FIG. 6 is a transistor level schematic diagram showing circuit 108, which is a portion of read-only ports (8:11) block 80 of FIG. 5. Circuit 108 illustrates the circuitry required for a single read-only port for bits 0 and 1.

Therefore, four instances of circuit 108 are required to complete block 80, since block 80 implements four read-only ports.

The read-only word line is provided to circuit 108 via conductor 109, which is part of bus 92 in FIG. 5. The read-only word line is provided to buffer 110, which comprises an NFET and a PFET. After being buffered by buffer 110, the read-only word line is provided in parallel to the gates of NFET transistors 114 and 116.

The drain terminals of transistors 114 and 116 are coupled to the read lines for bit 0 and bit 1, respectively, using a configuration known in the art as a shared drain output. The source terminals of transistors 114 and 116 are coupled to the drain terminals of NFET transistors 118 and 120, respectively. The source terminals of transistors 118 and 120 are coupled to the ground signal GND. Finally, the gate of transistor 118 is coupled to storage element 76, which is bit 0, and the gate of transistor 120 is coupled to storage element 78, which is bit 1.

Before a read cycle, the read lines are charged with a positive voltage by a circuit not shown in FIG. 6. Thereafter, the read-only word line goes high and is applied to the gate terminals of transistors 114 and 116 via conductor 112. If bit 0 from storage element 76 is high, the charge on the read line for bit 0 is conducted to ground via transistors 114 and 118. However, if bit 0 is low, the charge remains on the read line for bit 0. Likewise, if bit 1 from storage element 78 is high, the charge on the read line for bit 1 is conducted to ground via transistors 116 and 120. However, if bit 1 is low, the charge remains on the read line for bit 1. After asserting the read-only word line, the read lines are sampled to see if charge remains on the read line. For each read line on which charge remains, a low value for the bit corresponding to that read line is provided to the execution unit performing the read operation. Similarly, for each read line on which charge has been removed, a high value for the bit corresponding to that read line is provided to the execution unit performing the read operation. Accordingly, the logic value present on a read line immediately after the read-only word line is asserted is the inverse of the logic value stored in the respective storage element.

Figure 7:
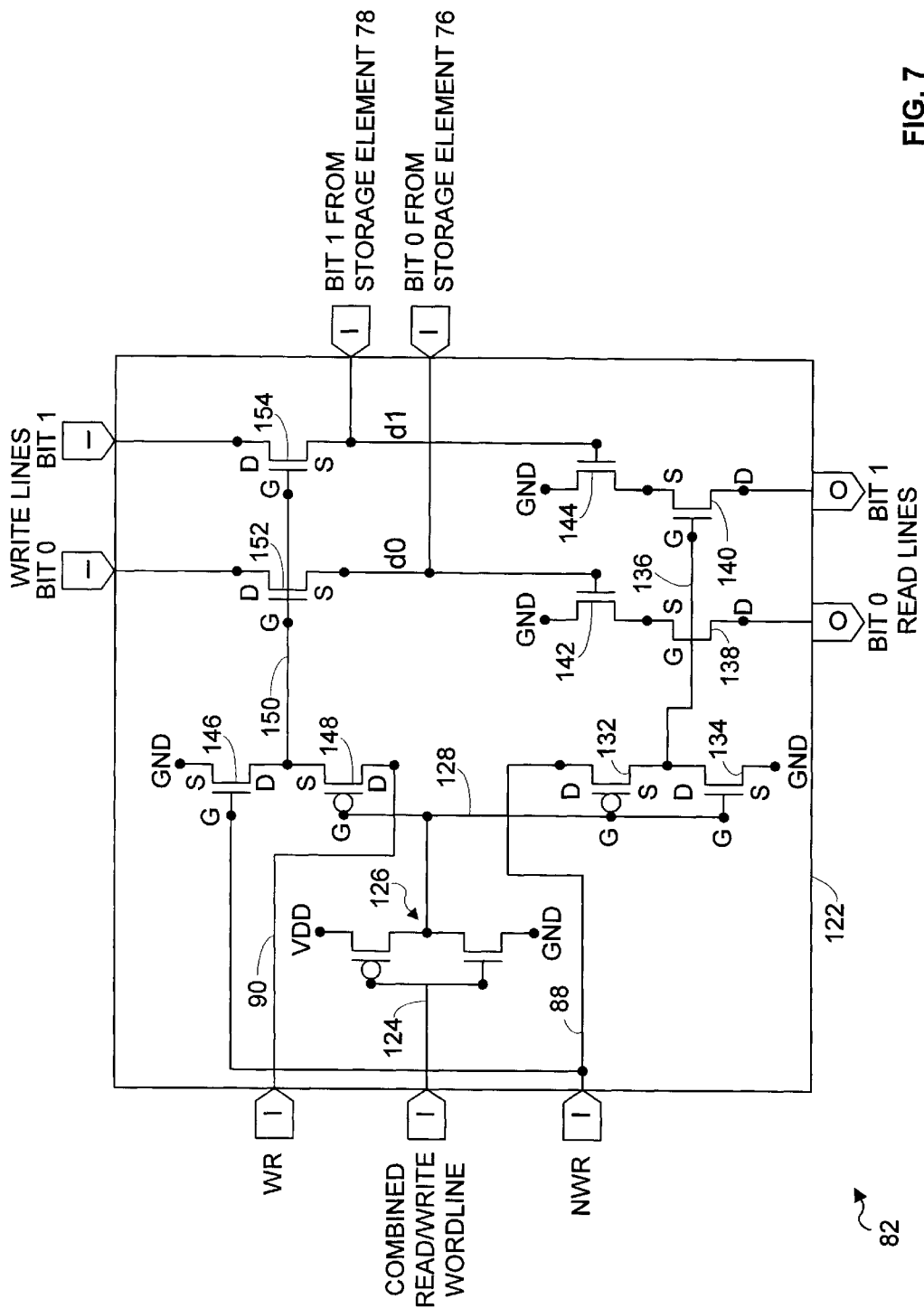

FIG. 7 is a transistor level schematic diagram showing circuit 122, which is a portion of read/write ports (0:7) block 82 of FIG. 5. Circuit 122 illustrates the circuitry required for a single read/write port for bits 0 and 1. Therefore, eight instances of circuit 122 are required to complete block 82, since block 82 implements eight read/write ports.

The combined read/write word line is provided to circuit 122 via conductor 124, which is part of bus 98 in FIG. 5. The read/write word line is provided to inverter 126, which comprises an NFET and a PFET. After being inverted by inverter buffer 110, the read-only word line is provided to conductor 128. The inverted direction line NWR is provided to circuit 122 from inverter 84 in FIG. 5 via conductor 88.

Conductor 88 is provided to the drain terminal of PFET transistor 132. The source terminal of transistor 132 is provided to the drain terminal of NFET transistor 134, and the drain terminal of transistor 134 is coupled to the ground signal GND. The gate terminals of transistors 132 and 134 are coupled to conductor 128, which is the inverted combined read/write word line. Transistors 132 and 134, and inverter 126 form a logical AND gate that performs a function similar to AND gate 66 in FIG. 4A. Accordingly, during a read operation, the combined read/write word line is high (with conductor 128 driven low) and the direction line WR is low (with conductor 88 driven high). This causes conductor 136 to be driven high. Conductor 136 is coupled to the node connecting the source of transistor 132 to the drain of transistor 134, and is provided to the gate terminals of NFET transistors 138 and 140.

As in circuit 108 of FIG. 6, the drain terminals of transistors 138 and 140 are coupled to the read lines for bits 0 and 1, respectively, using a shared drain output configuration. When a read operation is performed, the read lines are precharged and the combined read/write word line is asserted. As described above, this causes conductor 136 to go high when the word line is driven high. If bit 0 from storage element 76 is high, the charge on the read line for bit 0 is conducted to ground via transistors 138 and 142. However, if bit 0 is low, the charge remains on the read line for bit 0. Likewise, if bit 1 from storage element 78 is high, the charge on the read line for bit 1 is conducted to ground via transistors 140 and 144. However, if bit 1 is low, the charge remains on the read line for bit 1. Similar to circuit 108 of FIG. 6, after asserting the combined read/write word line, the read lines are sampled to see if charge remains on the read line. For each read line on which charge remains, a low value for the bit corresponding to that read line is provided to the execution unit performing the read operation. Similarly, for each read line on which charge has been removed, a high value for the bit corresponding to that read line is provided to the execution unit performing the read operation. Accordingly, the logic value present on a read line immediately after the read-only word line is asserted is the inverse of the logic value stored in the respective storage element.

Next, consider circuit 122 during a write operation. First, the direction line WR goes high and the inverted direction line NWR goes low. As described above, this causes storage elements 76 and 78 in FIG. 5 to be powered down. Also, since conductor 88 (NWR) is low, conductor 136, which is provided to the gate terminals of transistors 138 and 140, is low, thereby causing the drain terminals of transistors 138 and 140 to remain in a high-impedance state.

The inverted combined read/write word line is provided to the gate input of PFET transistor 148 via conductor 128 and the inverted direction line NWR is provided to the gate input of NFET transistor 146 via conductor 88. The direction line WR is provided to the drain terminal of transistor 148 via conductor 90. The source terminal of transistor 148 is coupled to the drain terminal of transistor 146, and the source terminal of transistor 146 is provided to the ground signal GND. Inverter 126 and transistors 146 and 148 form a logical AND gate similar to gate 62 in FIG. 4A. When the direction line WR and the combined read/write word line are both driven high, conductor 150 is driven high. Conductor 150 is coupled to the node connecting the drain terminal of transistor 146 to the source of transistor 148, and is provided to the gate terminals of transistors 152 and 154.

During a write operation, immediately before the combined read/write word line is asserted, the execution unit drives the word lines for bits 0 and 1 to the values to be written to the register. Accordingly, when conductor 150 is driven high, the values present on the word lines for bit 0 and bit 1 are driven through transistors 152 and 154 to storage elements 76 and 78, respectively. Since storage elements 76 and 78 are powered down, transistors 152 and 154 need not overpower output drivers of the storage elements, as is common in the prior art.

The write operation ends with the combined word line and the direction line WR being driven low. This causes storage elements 76 and 78 to be powered up and to retain the value written via transistors 152 and 154, respectively. In addition, the source terminals of transistors 152 and 154 reenter a high-impedance state, and the write operation is complete. In addition, since the combined read/write word line is driven low, the drain terminals of transistors 138 and 140 remain in a high-impedance state throughout the write operation, thereby allowing the read lines for this port to be used during a read operation at another register.

Figure 8:
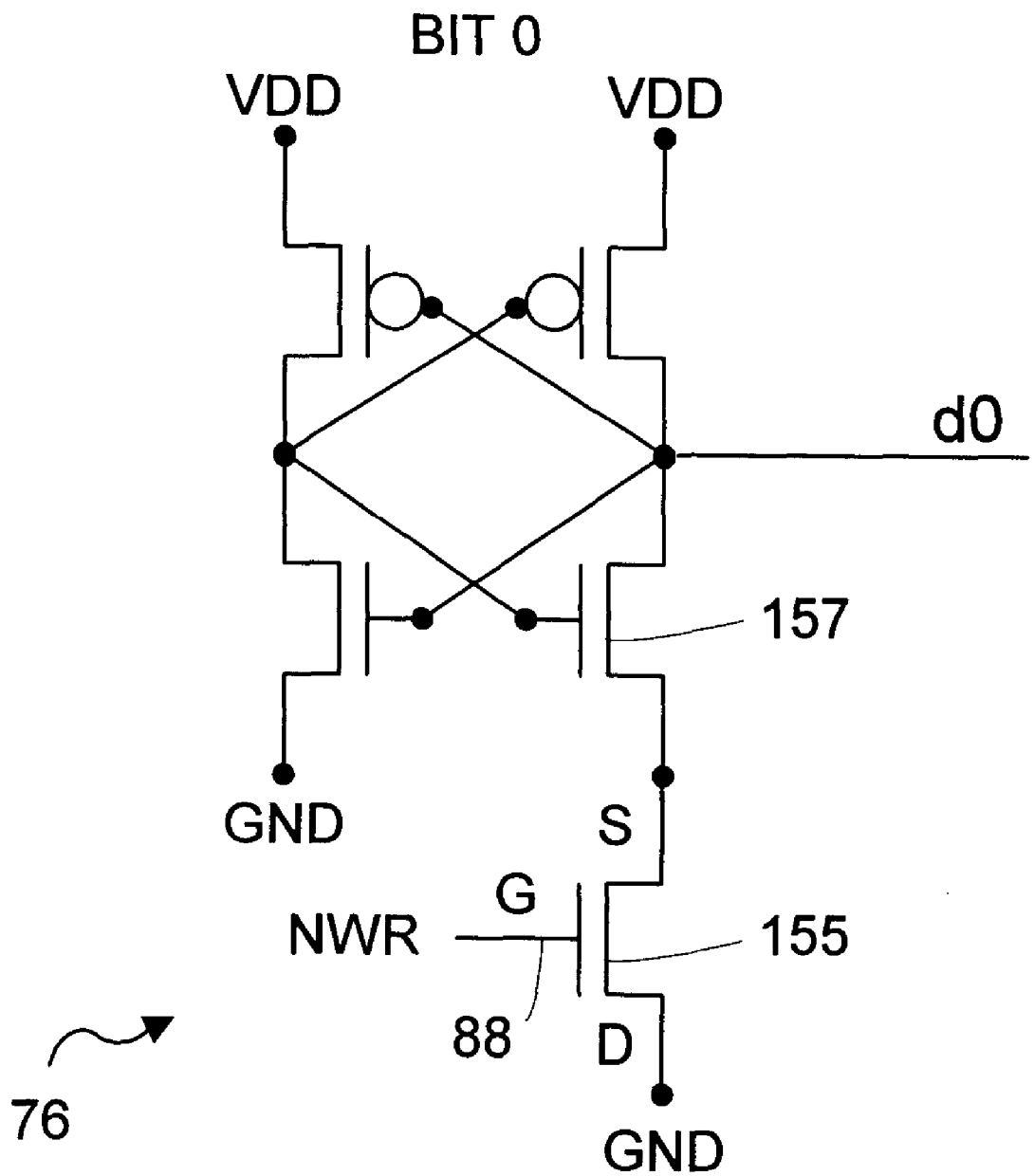
FIG. 8 shows another embodiment of a storage element shown in FIG. 5.

FIG. 8 shows another embodiment of storage element 76 of FIG. 5 that corresponds to the other embodiment of storage element 58 of FIG. 4B. In FIG. 8, storage element 76 remains powered up during write operations. However, the gate terminal of transistor 155 is coupled NFET transistor 155 via conductor 88. Accordingly, during a write operation, NWR is driven low. This shuts off the current path through NFET transistor 157, and places the conductor for bit 0 (labeled "d0" in FIG. 8) in a high-impedance state, thereby providing the same benefit as powering down the storage element since the transistors that drive the storage element during a write operation, such as transistors 152 and 154 in FIG. 7, do not need to overpower the transistors of the storage elements. When not performing a write operation, NWR is high and the current path through transistor 157 is enabled, thereby maintaining the value stored in the storage element.

The present invention provides two important benefits over the prior art. First, by powering down storage elements or placing storage elements in a high-impedance state during write operations, smaller transistors can be used to drive a value into the storage elements. By using smaller transistors, the size and power requirements of the register file are reduced. Second, by using a direction line and combined read/write word lines for read and write ports, the number of horizontal lines running across the register file are reduced. In accordance with the present invention, each of these benefits may be achieved independently. For example, in a register file having separate read and write word lines, as in the prior art, all the write word lines may be gated together to form a write signal that is used to power down the storage elements of a register or place the storage elements in a high-impedance state. While such a register file would still have a larger number of word lines, as in the prior art, it would also have smaller write buffer output driver transistors than those used in prior art register files. Similarly, combined read/write word lines and a single direction line may be used in a register file having storage elements that do not power down and do not enter a high-impedance state. While such a register file would still have relatively larger write buffer output driver transistors, as in the prior art, it would also have a reduced number of horizontal lines compared to prior art register file organizations. Of course, substantial synergy is obtained when both benefits are provided in the same register file, since the same direction line that is used to determine whether a combined read/write word line represents a read port or a write port is also used to power down a storage element or place a storage element in a high-impedance state.

The trend in the art of computer design is to have large numbers of execution units access a register file in parallel. The present invention provides a computer designer with the ability to implement a register file having a large number of read and write ports, while reducing the number of horizontal lines and reducing the size of output driver transistors used during write operations compared to prior art register file configurations.

Although the present invention has been described with reference to certain embodiments, workers skilled in the art will recognize that changes may be made in form and detail without departing from the spirit and scope of the invention.

What is claimed is:

1. A computer processor comprising:
   a plurality of execution units;
   a register file comprising:
   R read ports;
   W write ports; and
   N registers, with each register having 1 bit positions, wherein each bit position of each register is accessed by:
   R read lines, with each read line associated with one of the R read ports;
   W write lines, with each write line associated with one of the W write ports;
   a direction line that assumes a write direction state during a write operation and a read direction state during a read operation;
   C combined read/write word lines, with each combined read/write word line associated with one of the R read ports and one of the W write ports; and
   R−W read-only word lines if R>W, wherein each read-only word line is associated with one of the R read ports not associated with a combined read/write word line; or
   W−R write-only word lines if W>R, wherein each write-only word line is associated with one of the W write ports not associated with a combined read/write word line;
   wherein each of the 1 bit positions includes:
   a storage element for storing a value associated with the bit position; and
   a storage element multiplexer that selectively couples one of the R read lines to the storage element to read a value from the storage element when the direction line assumes the read direction state and one of the read-only or combined read/write word lines is asserted, wherein the read line selected is associated with the same read port as the asserted read-only or combined read/write word line, and selectively couples one of the W write lines to the storage element to write a value to the storage element when the direction line assumes the write direction state and one of the write-only or combined read/write word lines is asserted, wherein the write line selected is associated with the same write port as the asserted write-only or combined read/write word line;
   a bus of write lines coupled between the execution units and the register file;
   a bus of read lines coupled between the execution units and the register file;
   a multiplexer;
   a bus of register index select lines coupled between the execution units and the multiplexer; and
   a bus of direction lines, combined read/write word lines, and read-only word lines if R>W, or write-only word lines if W>R, coupled between the multiplexer and the register file.

2. The computer processor of claim 1 wherein each storage element includes a node that is coupled to the storage element multiplexer to receive a value from one of the W write lines via the storage element multiplexer during a write operation, and the node assumes a high-impedance state when the direction line assumes the write direction state.

3. The computer processor of claim 2 wherein the node is also coupled to the storage element multiplexer to provide a value to one of the R read line via the storage element multiplexer during a read operation, and the node assumes an active state based on the value stored in the storage element when the direction line assumes the read direction state.

4. The computer processor of claim 3 wherein the storage element powers down when the direction line assumes the write direction state, thereby causing the node to enter the high-impedance state.

5. The computer processor of claim 4 wherein each storage element comprises first and second inverters coupled into a feedback loop, and the node is derived from the output of either the first or second inverter.

6. The computer processor of claim 2 wherein each storage element includes a tri-state inverter having an output coupled to the node, and the output of the tri-state inverter enters the high-impedance state when tie direction line assumes the write direction state.

7. The computer processor of claim 6 wherein the storage element includes a second inverter, and the tri-state inverter and the second inverter are coupled into a feedback loop.

* * * * *